(12) United States Patent
Gupta

(10) Patent No.: US 6,362,698 B1
(45) Date of Patent: Mar. 26, 2002

(54) LOW IMPEDANCE CLAMPING BUFFER FOR AN LC TANK VCO

(75) Inventor: Sandeep K. Gupta, Mountain View, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/675,973

(22) Filed: Sep. 29, 2000

(51) Int. Cl.$^7$ ................................................. H03B 5/12
(52) U.S. Cl. .................... 331/117 FE; 331/34; 331/167; 331/117 R; 331/185; 330/98; 330/310
(58) Field of Search ........................... 331/34, 175, 182, 331/183, 185, 117 FE, 167, 117 R; 330/310, 311, 98, 308

(56) References Cited

U.S. PATENT DOCUMENTS 5,739,729 A * 4/1998 Tchamov et al. ........ 331/117 R

* cited by examiner

*Primary Examiner*—Arnold Kinkead
(74) *Attorney, Agent, or Firm*—Blakely, Sokoloff, Taylor & Zafman LLP

(57) ABSTRACT

A circuit for conditioning an input control voltage signal that is used to drive an LC tank oscillator in a phase locked loop (PLL). The conditioning circuit includes a two-stage amplifier including a first stage amplifier connected to a second stage comprising an active cascode circuit, a diode-connected transistor and a resistor tied to a reference voltage (e.g. ground). The first stage amplifier receives a control voltage input signal, which would typically be produced at the output of a loop filter in a PLL, and produces a conditioned control voltage output signal at its output, which is connected to the drain of the diode-connected transistor. The purpose of the amplifier is to lower the impedance of the conditioned output signal, which is then used to drive the LC tank oscillator, wherein the series resistor acts both to lower the impedance and to act as the degenerating resistor for the diode-connected transistor. In addition, a clamping circuit comprising a second active cascode structure is provided to clamp the conditioned control voltage output signal such that it is prevented from falling below a predetermined value.

17 Claims, 3 Drawing Sheets

LOW IMPEDANCE CLAMPING BUFFER FOR AN LC TANK VCO

BACKGROUND OF THE INVENTION

1. Field of the Invention

The present invention generally concerns phase locked loops (PLLs), and in particular concerns conditioning circuitry for use with PLLs that employ LC tank voltage-controlled oscillators.

2. Background Information

Phase locked loop (PLL) circuits are used to provide precise control of a frequency output signal in many types of electronic devices. A PLL circuit 10 corresponding to a typical PLL is shown in FIG. 1. PLL circuit 10 employs a closed feedback loop comprising a phase detector 12, a charge pump 14, a loop filter 16, and an oscillator, such as voltage-controlled oscillator (VCO) 18 or a current-controlled oscillator (ICO) (not shown). PLLs may also include a frequency divider 22 in the feedback portion of the loop. Ideally, a PLL will produce an output signal 20 ($F_{out}$) having a frequency that matches a reference frequency control signal 24 ($F_{ref}$).

Phase locked loops work in the following manner. The frequencies of output signal 20 (the loop feedback signal) and frequency control signal 24 are compared by phase detector 12, which outputs a pair of digital control signals 26 and 28 to charge pump 14. It will be understood by those skilled in the art that various types of phase detectors may be used, including phase detectors that output other types of control signals. The control signals selectively activate the current sources in charge pump 14 to control the voltage level of an unfiltered signal 30, which is then filtered by the passive elements (i.e., capacitors $C_2$ and $C_3$ and resister $R_2$) of loop filter 16 to produce a filtered VCO control signal 32. This control signal drives VCO 18, which produces output signal 20, wherein the frequency of output signal 20 is a direct function of the voltage level of filtered VCO control signal 32. In many instances, the frequency characteristic of the various circuit components will be such that it will be preferable to employ frequency divider 22, e.g., when the desired frequency is >1 MHz.

The characteristics of VCO 18 are very important to the performance of the PLL. Preferably, VCO 18 should be resistant to power supply and ground noise, coupling of spurious frequencies from nearby devices, have minimized jitter, and be able to provide a large variable frequency output based on a small variation in the voltage level of its input control signal.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE ILLUSTRATED EMBODIMENTS

In recent years, a circuit structure known as an "LC tank" has been implemented in the voltage-controlled oscillators of various PLL designs. LC tank VCO's provide better noise characteristics and improved performance when compared with conventional ring oscillators. However, the LC tank is still susceptible to some noise injection from the substrate due to the parasitic diodes formed by the varactors, and forward biasing of diode problems. The present invention provides conditioning circuitry that substantially reduces these problems.

Figure 2:
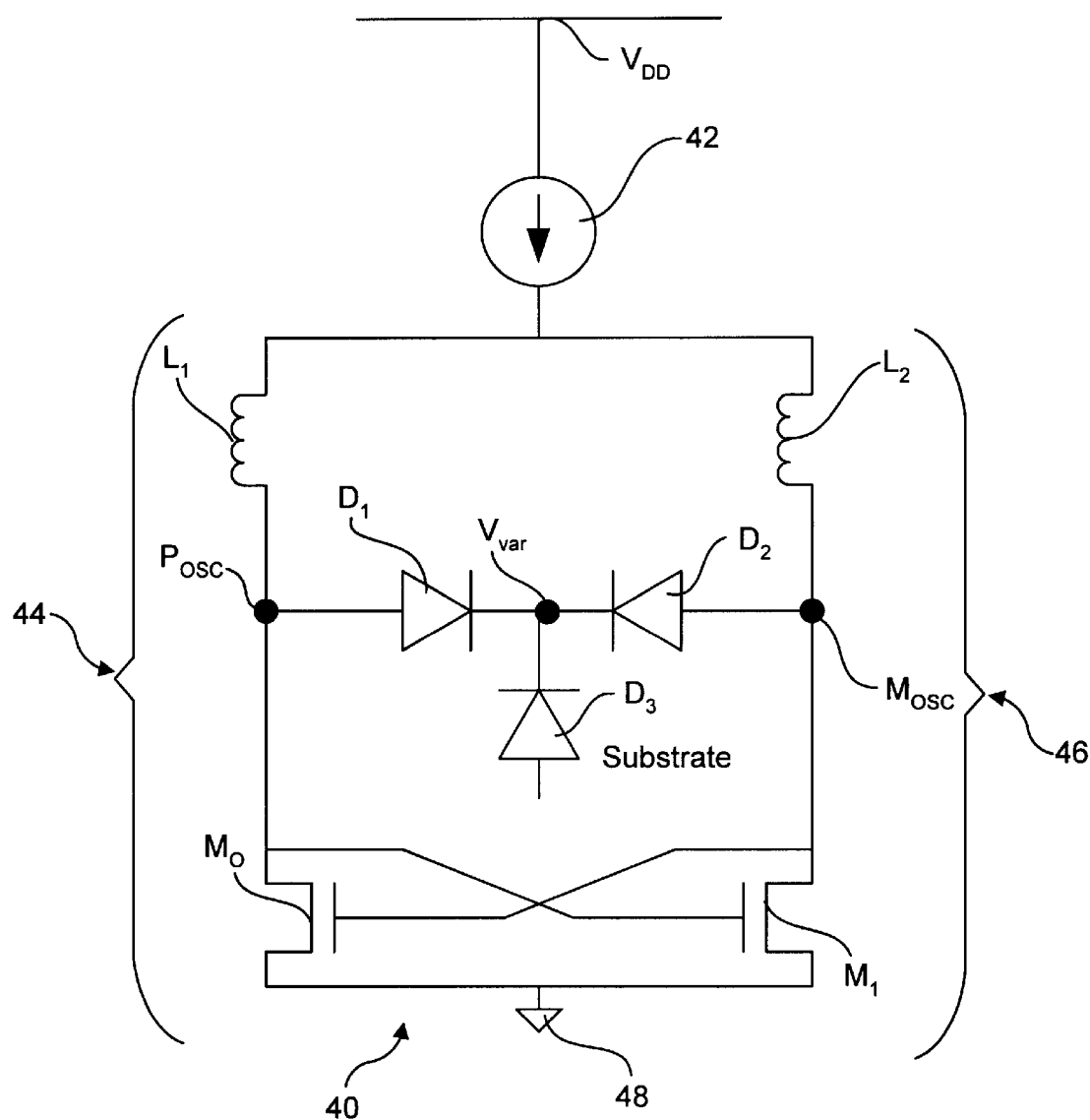
FIG. 2 is a detailed schematic of a typical LC tank voltage-controlled oscillator (VCO)

A schematic diagram of a typical LC tank oscillator 40 is shown in FIG. 2. LC tank oscillator 40 comprises a current source 42 that supplies current to a pair of substantially identical parallel circuit paths 44 and 46, both of which are supplied with a voltage level of $V_{DD}$ minus a drop across current source 42 at one end and are tied to a common ground 48 at the other end. Circuit path 44 comprises an inductor $L_1$ and an NMOS transistor $M_0$ while circuit path 46 comprises an inductor $L_2$ and an NMOS transistor $M_1$. Also, the gate controls for NMOS transistors $M_1$ and $M_2$ are cross-coupled such that the drain of NMOS transistor $M_1$ is connected to the gate of NMOS transistor $M_2$, while the drain of NMOS transistor $M_2$ is connected to the gate of NMOS $M_1$. LC tank oscillator 40 additionally includes a pair of diodes $D_1$ and $D_2$, each connected at one end between the inductor and NMOS transistor of respective circuit paths 44 and 46, and at the other end at a common node $V_{var}$ which is the control voltage for the diodes. This controls the capacitance of the diodes and hence the diodes can be regarded as varactors, i.e. voltage controlled capacitors. Accordingly, the control voltage $V_{var}$ controls the output frequency of the circuit, since the frequency of oscillation is the resonance frequency of the LC tank, which is inversely proportional to the square root of the multiple of tank inductance and the tank variable capacitance.

The output signal is obtained through a differential voltage across nodes $P_{osc}$ and $M_{osc}$, which correspond to the inputs of diodes $D_1$ and $D_2$, respectively. As $V_{var}$ is varied, an LC resonance is created in the circuit corresponding to the inductance (L) of inductors $L_1$ and $L_2$ and the capacitance across diodes $D_1$ and $D_2$ ($C_{D1}$ and $CD_2$). $V_{var}$ preferably should be driven by a low impedance buffer so that the high frequency currents through the diodes do not disturb the voltage at the common node of the diodes. Additionally, node $V_{var}$ can have 8–10 pf of capacitance, which means that the impedance of the buffer driving it, ideally, should be such that for high bandwidth PLL's (e.g., bandwidth >~1 Mhz), the pole contribution is an order of magnitude beyond the third pole in the PLL. As a result, this pole should be at least two orders of magnitude beyond the bandwidth of the PLL. To achieve this reliably, a very low impedance buffer (>100 ohms) is required. Furthermore, in a typical production process, diodes $D_1$ and $D_2$ would be constructed as p diffusions in an nwell in a single well process, which creates a parasitic diode $D_3$, comprising the nwell-to-substrate diode. Diode $D_3$ is an injection path for the substrate noise to get into node $V_{var}$. In order to minimize this injection, node $V_{var}$ needs to have an impedance that is as low as possible.

In addition to the foregoing preferred circuit characteristics, there should be a clamp for the low-going voltage on the control node of the varactors so that the diodes do not go into forward bias for any portion of the oscillation. Nodes $P_{osc}$ and $M_{osc}$ sit at a voltage level that equals the threshold voltage $V_{tmos}$ of MOS devices $M_0$ and $M_1$ plus the overdrive, $V_{ov}$ required by NMOS devices $M_0$ and $M_1$. Additionally, if the oscillation amplitude is A and the diode threshold voltage is $V_{tdio}$, $$V_{var} > V_{tmos} + V_{ov} + A - V_{tdio} \tag{1}$$

should be satisfied so that diodes $D_1$ and $D_2$ remain in the reverse bias region. Accordingly, this puts a limit on the low-going voltage on node $V_{var}$.

The effect of supply and ground noise should have a minimal effect on the performance of LC tank circuit 40. Since the inductance is relatively invariant to voltage across it, minimizing the variation of the voltage across the diodes $D_1$ and $D_2$ due to supply and ground noise is imperative to minimize jitter in the LC tank.

Figure 3:
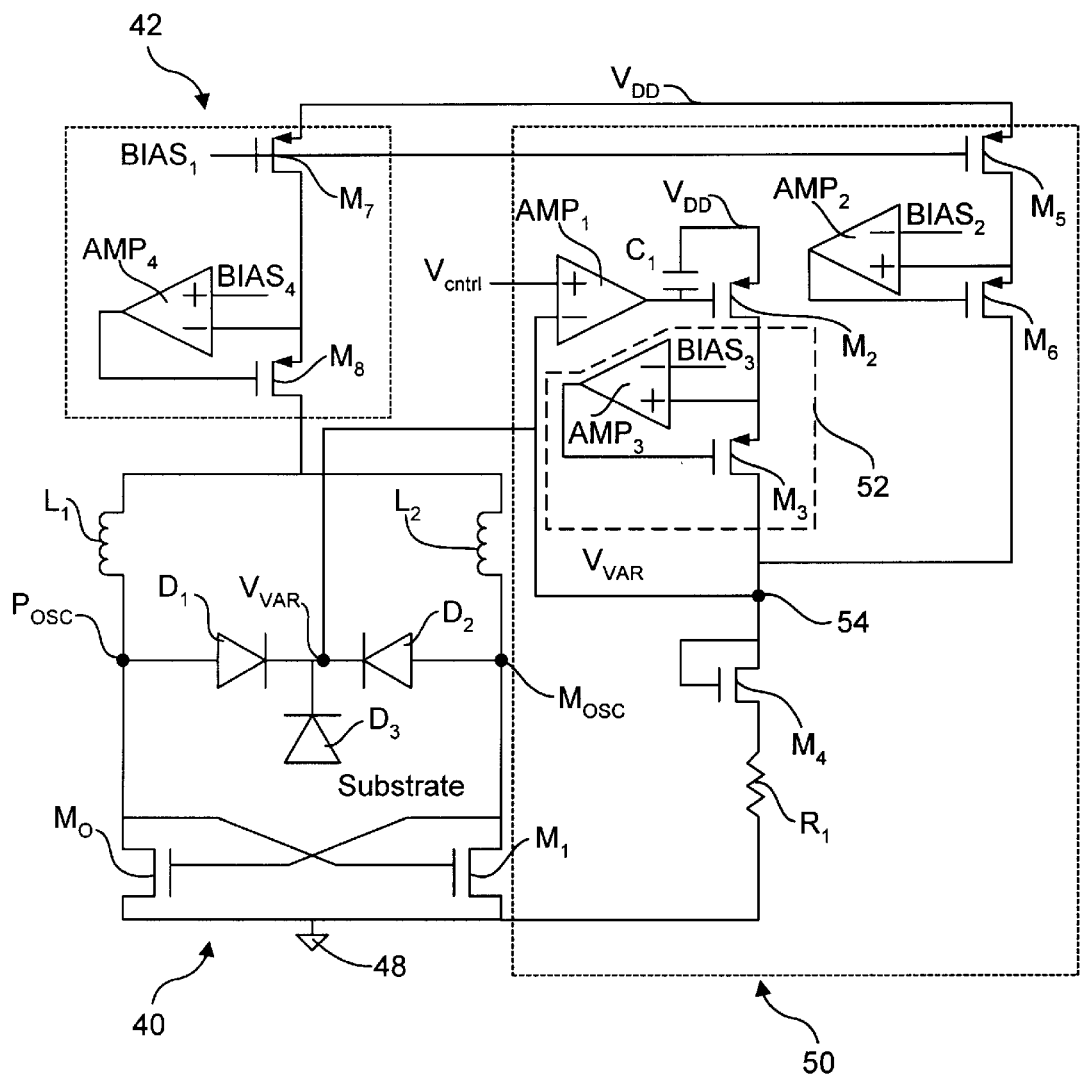
FIG. 3 is a detailed schematic diagram illustrating an exemplary implementation of the present invention in accord with the LC tank VCO of FIG. 2.

An exemplary conditioning circuit 50 implementation of the present invention when applied to LC tank oscillator 40 is shown in FIG. 3. As shown in the Figure, conditioning circuit 50 includes PMOS devices $M_2$ and $M_3$, an NMOS device $M_4$, transistors $M_5$, $M_6$, amplifiers $Amp_1$ and $Amp_2$, a capacitor $C_1$, and a diffusion resistor $R_1$. As will be recognized by those skilled in the art, amplifier $Amp_3$, and PMOS devices $M_2$ and $M_3$ form a first active cascode structure. Additionally, amplifier $Amp_2$ and transistors $M_5$ and $M_6$ form a second active cascode structure.

Figure 1:
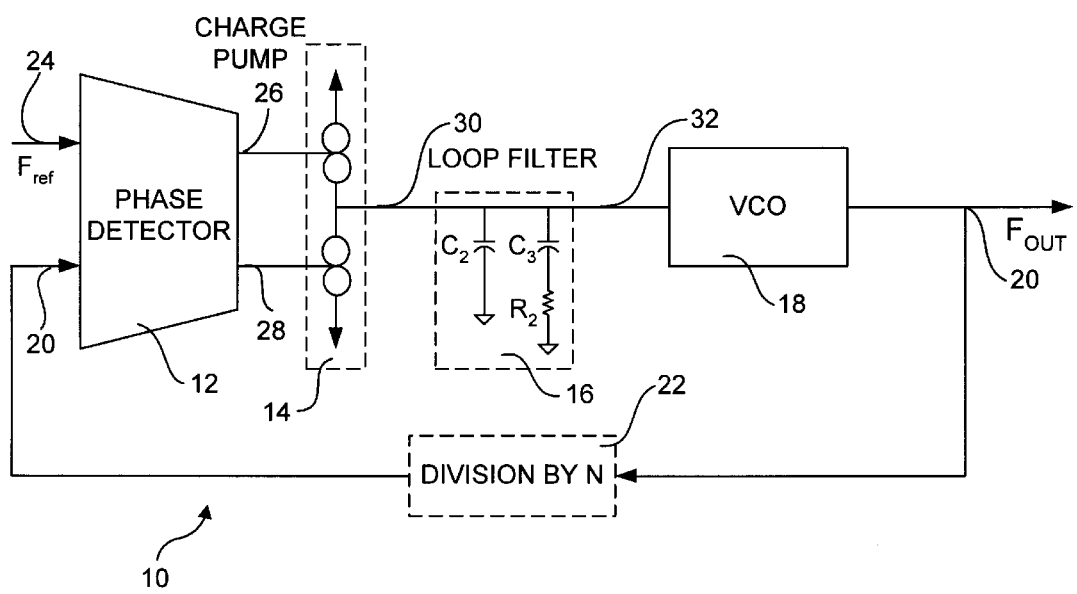
FIG. 1 is a schematic block diagram of a conventional phase locked loop circuit.

$V_{DD}$ is the power supply voltage for the circuit, which is preferably set at 1.6 v for this exemplary implementation, but may be set at other voltages for this and other implementations of the invention. A control voltage $V_{cntrl}$ corresponding to filtered control voltage 32 in the PLL circuit of FIG. 1 is used as an input signal to conditioning circuit 50, which outputs a conditioned control voltage output signal that is used to control the frequency of the differential voltage produced across nodes $P_{osc}$ and $M_{osc}$, which corresponds to frequency output signal 20. In addition, $V_{var}$ is connected to conditioning circuit 50 at a node 54.

As will be understood by those skilled in the art, amplifier $Amp_1$, PMOS device $M_2$, NMOS device $M_4$ and resistor $R_1$ form a two-stage amplifier. Amplifier $Amp_1$, which provides the first stage of the two-stage amplifier, receives control voltage $V_{cntrl}$ at its non-inverting terminal and $V_{var}$ at its inverting terminal. The output of amplifier $Amp_1$ is tied to the gate of PMOS device $M_2$, while source of device $M_2$ is tied to the power supply VDD.

Amplifier $Amp_1$ typically may comprise a single-ended simple differential amplifier with a gain of around 20–100, depending on the implementation. Capacitor $C_1$ acts as the compensating capacitor for the first stage and also makes the gate of transistor $M_2$ referenced to $V_{DD}$.

A portion of the gain of the two-stage amplifier is obtained through the second stage formed by transistors $M_2$, $M_4$, and $R_1$. NMOS transistor $M_4$, which is diode-connected, is connected in series with diffusion resistor $R_1$. The series resistance is used to limit the large amount of current that would otherwise flow due to the square-law nature of the diode-connected device $M_4$ for large $V_{var}$ voltages.

The output resistance of this structure is given by, $$(R_1 + 1/gm_4)/Av \qquad (2)$$

where $gm_4$ is the transconductance of the diode-connected NMOS transistor $M_4$ and $A_v$ is the overall gain of the two-stage amplifier. The series resistance can be kept high enough without sacrificing the output resistance, as $A_v$ is directly proportional to $R_1$ and $1/gm_4$ is kept small compared to $R_1$. Thus, sufficient gain can be obtained out of the second stage so as to push $A_v > 100$ by raising $R_1$ to provide at least a gain of 3–4 in the second stage. The output resistance can be made <50 ohms easily for almost all control voltages in the range $0.45 < V_{var} < 1.15$ for a 1.6 v supply. Making node 54 have low impedance is very good for protection against the noise coupling from the substrate through diode $D_3$ onto node $V_{var}$. This is an important aspect of the invention.

As noted above, transistors $M_5$ and $M_6$ and amplifier $Amp_2$ form an active cascode structure, wherein the source of transistor $M_5$ is connected to $V_{DD}$ and the drain of transistor $M_5$ is connected to the non-inverting input of amplifier $Amp_2$ and the source of transistor $M_6$. A bias voltage bias1 is tied to the gate of transistor $M_5$. Another bias voltage $bias_2$ is connected to the inverting input of amplifier $Amp_2$, while the output of amplifier $Amp_2$ is connected to the gate of transistor $M_6$. These bias voltages depend on the particular implementation. As a result of this second path comprising transistors $M_5$ and $M_6$, a small current, $I_{min}$, will flow through NMOS transistor $M_4$ even when the control voltage $V_{cntrl}$ drops below the input common mode voltage of amplifier $Amp_1$. Accordingly, this clamps voltage $V_{var}$ at slightly higher than the threshold voltage of device $M_4$. Preferably, the threshold voltage of $M_4$ is the same as devices $M_0$ and $M_1$. This determines the amplitude of oscillation A so that equation (1) is satisfied for the lowest $V_{var}$ clamp voltage.

Node $V_{cntl}$ is ground-referenced when the PLL is locked and the charge pump is not transistoring due to the absence of phase frequency detector pulses. Preferably, capacitor $C_3$ of loop filter 16 will have a large capacitance, while capacitor $C_2$ will have a smaller capacitance. In this configuration, capacitor $C_2$ corresponds to a jitter suppression capacitor, which provides the third pole in the system. The voltage at node $V_{var}$ follows the voltage of $V_{cntrl}$ up to the bandwidth of the two-stage amplifier. This ensures that $V_{var}$ is ground-referenced up to mid-band frequencies around 100 MHz. Beyond that, node $V_{var}$ is again ground-referenced depending on the ratio of the impedance of $M_4$ and $R_1$ to the impedance looking into M3 and M2. Similarly, node $P_{osc}$ and node $M_{osc}$ which form the output of the LC tank, are ground referenced up to 100 MHz because of the high transconductance of devices $M_0$ and $M_1$. For frequencies beyond this, the capacitance of diode $D_1$ shorts nodes $V_{var}$ and $P_{osc}$, while the capacitance of diode $D_2$ shorts nodes $V_{var}$ and $M_{osc}$. Therefore, very good differential rejection with respect to ground noise is obtained on both $V_{var}$–$P_{osc}$ and $V_{var}$–$M_{osc}$.

As discussed above, conditioning circuit 50 may also include active cascode structure 52 to increase the gain of the first stage of the two-stage amplifier. As shown in FIG. 3, in active cascode structure 52 the drain of PMOS transistor $M_2$ is connected to the non-inverting input of an amplifier $Amp_3$ and the source of PMOS transistor $M_3$, while the inverting input of the amplifier is provided with a bias voltage $bias_3$. The output of amplifier $Amp_3$ is connected to the gate of PMOS transistor $M_3$.

For power supply rejection, both of devices $M_2$ and $M_3$ have their respective drain and gate voltage supply referenced, and accordingly, carry a current invariant to the supply variations. This is accomplished by keeping the voltages for $bias_2$, $bias_3$, and $bias_4$ supply referenced. Hence, very good rejection is obtained for the nodes $P_{osc}$, $M_{osc}$ and $V_{var}$ for mid-band frequencies up to 100 MHz. For frequencies higher than this, the diodes $D_1$ and $D_2$ short out the nodes $V_{var}$ to $P_{osc}$ and $M_{osc}$, thus giving very good rejection over the entire frequency range from below 1 khz to several 10's of GHz. However, this requires that the diode capacitance be of the order of 8–10 pf for good power supply rejection across the whole frequency range. If the diode capacitance is much smaller, the rejection may not be as good for some mid-band frequencies, such as 100–200 MHz. Thus, the present invention is generally limited to VCO's running not much higher than around 1.5 GHz because the capacitance value for such VCO's may be much smaller. If the invention is used for low capacitances of the diodes, all the other beneficial effects of the invention would still be obtained, although the power supply rejection may not be very good for some mid band frequencies.

Also shown in FIG. 3 is an exemplary circuit for current source 42, which includes transistors $M_7$ and $M_8$ and an amplifier $Amp_4$. Transistors $M_7$, $M_8$, and amplifier $Amp_4$ form another active cascode structure with the LC tank circuitry. In this configuration, the source of transistor $M_7$ is connected to $V_{DD}$ and the drain of transistor $M_7$ is connected to the non-inverting input of amplifier $Amp_4$ and the source of transistor $M_8$, while the output of amplifier $Amp_4$ is connected to the gate of transistor $M_8$. A bias voltage $bias_1$ is connected to the gate of transistor $M_7$ and a bias voltage $bias_4$ is provided at the inverting terminal of amplifier $Amp_4$. This active cascading structure is used to provide good power supply rejection. It will be understood by those skilled in the art that other circuit structures may be used for current source 42, including other types of active cascoding structures.

The above description of illustrated embodiments of the invention is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. Accordingly, it is not intended that the scope of the invention in any way be limited by the above description, but instead be determined entirely by reference to the claims that follow.

What is claimed is:

1. A voltage-controlled oscillator (VCO) circuit, comprising:
    an LC tank oscillator enabled to produce an oscillation at a controlled frequency in response to a conditioned control voltage output signal received at an input;
    an amplification circuit comprising a two-stage amplifier including a first amplification stage having an input to receive an oscillation control voltage signal and an output connected to an input of a second amplification stage, said second amplification stage comprising a first active cascode structure having an input coupled to the output of the first amplification stage, a diode-connected transistor connected to an output of the two-stage amplifier and connected in series with a resistor tied to a reference voltage to produce the conditioned control voltage output signal at an output, said conditioned control voltage output signal substantially equaling a voltage level of the oscillation control voltage signal; and
    a clamping circuit to clamp the conditioned control voltage output signal from falling below a predetermined level.

2. The VCO circuit of claim 1, wherein the clamping circuit comprises a second active cascode structure that is enabled to produce a sufficient current at an output that is connected to an output of the amplification circuit such that the conditioned control voltage output signal does not fall below the predetermined level.

3. A voltage-controlled oscillator (VCO) circuit, comprising:
    an LC tank oscillator to produce an oscillation at a controlled frequency in response to a conditioned control voltage output signal received at an input, comprising:
        a current source having inputs to receive a supply voltage and a bias voltage and having an output to supply current into;
        a first parallel branch having an input at a first end connected to the output of the current source and a second end connected to a ground voltage and including a first inductor connected in series to a first MOSFET having a gate, drain and a source connected to the ground voltage;
        a second parallel branch having an input at a first end connected to the output of the current source and a second end connected to the ground voltage and including a second inductor connected in series to a second MOSFET having a gate, drain and a source connected to the ground voltage;
        a first diode having a first end connected between the first inductor and the first MOSFET and having a second end; and
        a second diode having a first end connected between the second inductor and the second MOSFET and a second end commonly connected to the second end of the first diode, said commonly connected ends of the first and second diodes connected to an output of an amplification circuit so as to receive the conditioned control voltage output signal;
        wherein the drain of the first MOSFET is connected to the gate of the second MOSFET and the drain of the second MOSFET is connected to the gate of the first MOSFET, and the LC tank oscillator produces a voltage differential across the first ends of the first and second diodes having a frequency based on the conditioned control voltage output signal;
    the amplification circuit to operate in a closed loop having an input to receive an oscillation control voltage signal and enabled to produce the conditioned control voltage output signal at an output, said conditioned control voltage output signal substantially equaling the voltage level of the oscillation control voltage signal; and
    a clamping circuit to clamp the conditioned control voltage output signal such that it does not fall below a predetermined level.

4. The VCO circuit of claim 3, wherein the current source comprises an active cascode structure connected to a supply voltage and enabled to produce a selectively controlled current at the inputs of the first and second parallel branches.

5. A phase locked loop (PLL) circuit comprising:
    a phase detector having a first input to receive a frequency reference signal and a second input enabled to produce a phase correction signal at an output;
    a charge pump having at least one input to receive the phase correction signal and enabled to produce a control voltage signal as an output in response to the phase correction signal;
    a loop filter having an input to receive the control voltage signal and enabled to produce a filtered control voltage signal as an output; and
    a voltage-controlled oscillator comprising:
        an LC tank oscillator having an input to receive a conditioned control voltage output signal and enabled to produce a frequency-controlled output signal having a frequency that is a function of the conditioned control voltage output signal;
        an amplification circuit having a gain connected in closed loop form comprising a two-stage amplifier including a first amplification stage having an input to receive the filtered control voltage signal and an output connected to an input of a second amplification stage including a first active cascode structure connected to the output of the first amplification stage, a diode-connected transistor connected to the output of the two-stage amplifier and connected in series with a resistor tied to a reference voltage, said amplification circuit enabled to produce the conditioned control voltage output signal so has to have a voltage substantially equaling a voltage level of the filtered control voltage signal; and a clamping circuit to clamp the conditioned control voltage output signal such that it does not fall below a predetermined level, wherein the frequency-controlled output signal is fed back into the second input of the phase detector to form a closed loop of the PLL.

6. The PLL circuit of claim 5, further comprising a frequency divider having an input to receive the frequency-controlled output signal and having an output connected to the second input of the phase detector.

7. A phase locked loop (PLL) circuit comprising:

a phase detector having a first input to receive a frequency reference signal and a second input enabled to produce a phase correction signal at an output;

a charge pump having at least one input to receive the phase correction signal and enabled to produce a control voltage signal as an output in response to the phase correction signal;

a loop filter having an input to receive the control voltage signal and enabled to produce a filtered control voltage signal as an output; and a voltage-controlled oscillator comprising:
  an LC tank oscillator having an input to receive a conditioned control voltage output signal and enabled to produce a frequency-controlled output signal having a frequency that is a function of the conditioned control voltage output signal;
  an amplification circuit having a gain connected in closed loop form and an input to receive the filtered control voltage signal and enabled to produce the conditioned control voltage output signal, said conditioned control voltage output signal having a voltage substantially equaling the voltage level of the filtered control voltage signal; and
  a clamping circuit comprising a current source including an active cascode structure that is enabled to produce a sufficient current at an output that is connected to the output of the amplification circuit such that the conditioned control voltage output signal does not fall below a predetermined level, wherein the frequency-controlled output signal is fed back into the second input of the phase detector to form a closed loop of the PLL.

8. A phase locked loop (PLL) circuit comprising:

a phase detector having a first input to receive a frequency reference signal and a second input to produce a phase correction signal at an output;

a charge pump having at least one input to receive the phase correction signal to produce a control voltage signal as an output in response to the phase correction signal;

a loop filter having an input to receive the control voltage signal to produce a filtered control voltage signal as an output; and a voltage-controlled oscillator comprising:
  an LC tank oscillator having an input to receive a conditioned control voltage output signal to produce a frequency-controlled output signal having a frequency that is a function of the conditioned control voltage output signal comprising,
    a current source having inputs to receive supply voltage and bias voltage and having an output;
    a first parallel branch having a first end connected to the output of the current source and a second end connected to a reference voltage and including a first inductor connected in series to a first MOSFET having a gate, drain and a source connected to the reference voltage;
    a second parallel branch having a first end connected to the output of the current source and a second end connected to the reference voltage and including a second inductor connected in series to a second MOSFET having a gate, drain and a source connected to the reference voltage;
    a first diode having a first end connected between the first inductor and the first MOSFET and having a second end; and
    a second diode having a first end connected between the second inductor and the second MOSFET and having a second end commonly connected to the second end of the first diode, said commonly connected ends of the first and second diodes connected to the output of the amplification circuit so as to receive the conditioned control voltage output signal,
    wherein the drain of the first MOSFET is connected to the gate of the second MOSFET and the drain of the second MOSFET is connected to the gate of the first MOSFET, and the LC tank oscillator produces a voltage differential across the first ends of the first and second diodes having a frequency based on the conditioned control voltage output signal;
  an amplification circuit having a gain connected in closed loop form and an input to receive the filtered control voltage signal and enabled to produce the conditioned control voltage output signal, said conditioned control voltage output signal having a voltage substantially equaling the voltage level of the filtered control voltage signal; and
  a clamping circuit that is enabled to clamp the conditioned control voltage output signal such that it does not fall below a predetermined level,
  wherein the frequency-controlled output signal is fed back into the second input of the phase detector to form a closed loop of the PLL.

9. A conditioning circuit comprising:

a two stage amplifier including:
  a first amplification stage having an input to receive a control voltage input signal and having an output;
  a second amplification stage comprising a first active cascode circuit with its input connected to the output of the first amplification stage, a diode-connected transistor having its drain and gate connected to the output of the two stage amplifier, a resistor connected in series to the source of the diode-connected transistor at a first end and tied to a reference voltage at a second end; and a clamping circuit including a current source comprising a second active cascode structure enabled to produce a sufficient current at an output connected to the output of the two stage amplifier such that the conditioned control voltage output signal is prevented from falling below a predetermined level regardless of a voltage level of the control voltage input signal.

10. The conditioning circuit of claim 9, wherein the conditioned control voltage output signal is received as an oscillation control input signal by an LC tank oscillator.

11. The conditioning circuit of claim 9, wherein the first amplification stage comprises:
   an operational amplifier having a non-inverting input to receive the control voltage input signal, an inverted input connected to receive the conditioned voltage control output signal, and an output; and
   a capacitor connected between a supply voltage and the output of the first operational amplifier.

12. The condition circuit of claim 11, wherein the second amplification stage further comprises a first active cascode structure having an input connected to the output of the first amplification stage and enabled to produce the conditioned voltage control output signal at an output.

13. The conditioning circuit of claim 12, wherein the first active cascode structure comprises:
   A PMOS transistor having a source tied to a supply voltage, a gate connected to receive the output of the first amplification stage, and a drain;
   an operational amplifier having a non-inverting input connected to the drain of the PMOS transistor, an inverting input to receive a bias voltage, and an output; and
   a PMOS transistor having a source connected to the drain of the first transistor and a gate connected to the output of the operational amplifier, and a drain from which the conditioned control voltage output signal is output from.

14. The conditioning circuit of claim 9, wherein the second active cascode structure comprises:
   a first transistor having a source connected to a supply voltage, a gate connected to a first bias voltage, and a drain;
   an operational amplifier having an non-inverting input connected to the drain of the first transistor, an inverting input connected to a second bias voltage, and an output; and
   a second transistor having a source connected to the drain of the first transistor, a gate connected to the output of the operational amplifier, and a drain comprising the output of the structure.

15. The conditioning circuit of claim 9, wherein the gain of the two-stage amplifier is proportional to a series resistance of the resistor and the diode-connected transistor.

16. The conditioning circuit of claim 9, wherein a resistance of the diode-connected transistor is reduced by a factor proportional to an open loop gain of the two stage amplifier.

17. The conditioning circuit of claim 9, wherein the sufficient current provided by the current source is large enough to ensure that the diode-connected transistor has a drain voltage that does not fall below its threshold voltage.

* * * * *

UNITED STATES PATENT AND TRADEMARK OFFICE
CERTIFICATE OF CORRECTION

PATENT NO. : 6,362,166 B1
DATED : March 26, 2002
INVENTOR(S) : Stephen E. Webber et al.

It is certified that error appears in the above-identified patent and that said Letters Patent is hereby corrected as shown below:

<u>Title page,</u>
Item [56], OTHER PUBLICATIONS,
In Orr et al. ...etc., "gen." should read -- Gen. --; and
In "Comprehensive Medical Chem. ... etc.", "Pargamon" should read
-- Pergamon --.

<u>Column 115,</u>
Line 47, "perforemd" should read -- performed --.

Signed and Sealed this

Third Day of December, 2002

JAMES E. ROGAN
*Director of the United States Patent and Trademark Office*